United States Patent
Isetani et al.

(10) Patent No.: US 7,261,350 B2
(45) Date of Patent: Aug. 28, 2007

(54) NEGATIVE PRESSURE ATTRACTION DEVICE AND ATTRACTION CONFIRMING SENSOR

(75) Inventors: Junichi Isetani, Tokyo (JP); Hiroshi Hatakeyama, Tokyo (JP); Hiroyuki Inagaki, Tokyo (JP); Shigeru Aoshima, Tokyo (JP)

(73) Assignee: Yamatake Corporation, Tokyo (JP)

( * ) Notice: Subject to any disclaimer, the term of this patent is extended or adjusted under 35 U.S.C. 154(b) by 186 days.

(21) Appl. No.: 10/517,363

(22) PCT Filed: Jun. 4, 2003

(86) PCT No.: PCT/JP03/07083

§ 371 (c)(1),
(2), (4) Date: Dec. 3, 2004

(87) PCT Pub. No.: WO03/101678

PCT Pub. Date: Dec. 11, 2003

(65) Prior Publication Data

US 2005/0200142 A1    Sep. 15, 2005

(30) Foreign Application Priority Data

Jun. 4, 2002    (JP) .............................. 2002-162870

(51) Int. Cl.
  *B25J 15/06*    (2006.01)
  *B25J 13/08*    (2006.01)
(52) U.S. Cl. ....................... 294/64.1; 294/65; 294/907; 901/40; 901/46

(58) Field of Classification Search ............... 294/64.1, 294/64.2, 64.3, 65, 907; 901/40, 46; 414/752.1, 414/627, 737
See application file for complete search history.

(56) References Cited

U.S. PATENT DOCUMENTS 4,653,741 A *   3/1987   Palmer ......................... 271/90
6,817,639 B2 * 11/2004   Schmalz et al. ........... 294/64.1

FOREIGN PATENT DOCUMENTS

| CN | 1318147 A     | 10/2001 |
|----|---------------|---------|
| JP | 60-42332 U    | 3/1985  |
| JP | 05-072067 A   | 3/1993  |
| JP | 07-314371 A   | 12/1995 |
| JP | 11-333774 A   | 12/1999 |
| JP | 2000-259255 A | 9/2000  |
| JP | 2001-068840   | 3/2001  |
| JP | 2002-071416 A | 3/2002  |
| JP | 2003-194608 A | 7/2003  |

* cited by examiner

*Primary Examiner*—Dean J Kramer
(74) *Attorney, Agent, or Firm*—Blakely Sokoloff Taylor & Zafman

(57) ABSTRACT

An air suction passage (4A, 4B) is provided with a pick and place confirming sensor (1) comprising a gas flow sensor. The pick and place confirming sensor (1) measures the flow rate of air sucked in from an air suction port (33) of a pick and place nozzle (2). The presence or absence of a part lifted to the pick and place nozzle (2) is detected on the basis of the measurement result.

7 Claims, 5 Drawing Sheets

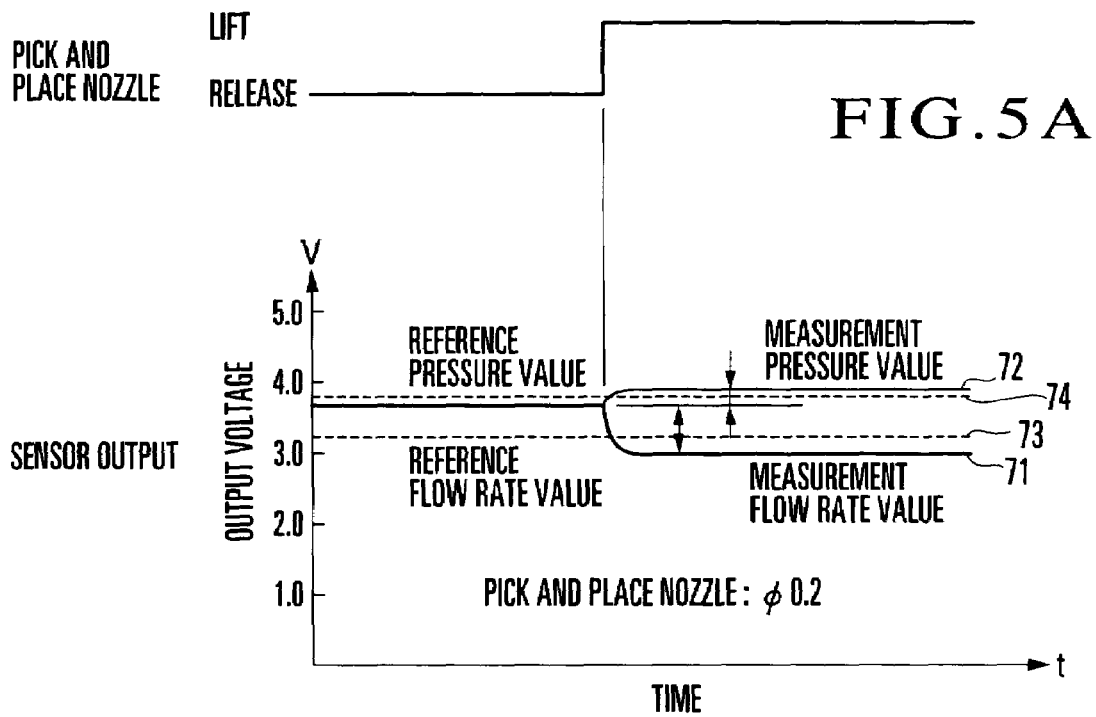
FIG. 5A
FIG. 5B
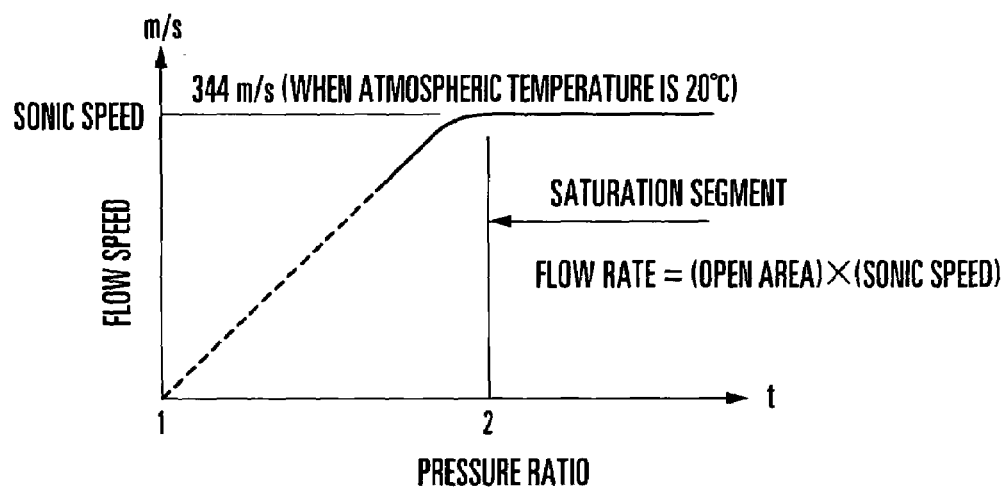
FIG. 6

NEGATIVE PRESSURE ATTRACTION DEVICE AND ATTRACTION CONFIRMING SENSOR

The present application is a non-provisonal application of International No. PCT/JP03/07083, filed Jun. 4, 2003.

BACKGROUND OF THE INVENTION

The present invention relates to a vacuum pick and place device and a pick and place confirming sensor and, more particularly, to a vacuum pick and place device and pick and place confirming sensor with which when air is sucked in from the air suction port of a pick and place nozzle by using a vacuum so as to lift a part to a vacuum cup having the air suction port, the presence or absence of the part to the vacuum cup is detected.

In general, when a small part such as an electronic component is to be transported, a vacuum pick and place device which lifts the part to an pick and place nozzle by using a vacuum is used. In a vacuum pick and place device of this type, a vacuum cup having an air suction port is formed in a pick and place nozzle. Air is sucked in from the air suction port by a vacuum generated by a vacuum generator such as an ejector or vacuum pump. Thus, the part is lifted to the vacuum cup of the pick and place nozzle.

In the vacuum pick and place device, the presence or absence of a part is determined, that is, whether or not a desired part has been lifted from a parts feeder such as a tape feeder or whether or not an lifted part has dropped while the part is transported to a parts mounting position on a printed wiring board is checked. If the part is not lifted, a process to deal with it, that is, an error process such as re-pick and place of the same part or warning must be performed at once.

Conventionally, when the presence or absence of a part lifted to a suction nozzle is to be confirmed, the pneumatic pressure in an air suction passage after the pick and place nozzle is measured by a pressure sensor. The presence or absence of an lifted part is determined on the basis of a change in pressure value measured by the pressure sensor.

This determination utilizes the following fact. When a part is lifted to the pick and place nozzle, the air suction amount from the air suction port decreases, and the pneumatic pressure in the air suction passage decreases as compared to a case wherein no part is lifted, that is, the air suction port is open.

Actually, a reference pressure indicating a pressure in the air suction passage when the air suction port is open is preset. The presence or absence of pick and place is determined on the basis of whether or not the measurement pressure value in the air suction passage actually measured by the pressure sensor during a lifting operation reaches the reference pressure value.

In the vacuum pick and place device, as the parts size decreases, the sectional area of the channel of the air suction port of the pick and place nozzle tends to decrease.

For example, in a precision electronic device such as a cell phone or electronic camera, to decrease the size and weight of the device, the area of the printed wiring board must be reduced. As a chip part such as a resistor or capacitor, a very small chip part with a size of 1.0 mm×0.5 mm or 0.6 mm×0.3 mm is used.

To lift such a part, a pick and place nozzle having a small air suction port with a channel sectional area of 0.2 mm or 0.1 mm must be used.

When, however, the channel sectional area of the air suction port of the pick and place nozzle is decreased along with the size reduction of the part, the flow rate of air passing through the small air suction port decreases. Accordingly, the difference between the reference pressure value described above and the measurement pressure value becomes very small. With the conventional scheme of detecting a pressure change with the pressure sensor, the presence or absence of a lifted part cannot be determined accurately.

SUMMARY OF THE INVENTION

The present invention has been made to solve this problem, and has as its object to provide a vacuum pick and place device and pick and place confirming sensor which can reliably detect the presence or absence of a lifted part even when the channel sectional area of the air suction port of the pick and place nozzle is small.

In order to achieve the above object, a vacuum pick and place device according to the present invention comprises an pick and place nozzle which includes a vacuum cup having an air suction port, a vacuum generator which generates a vacuum and sucks in air from the air suction port of the pick and place nozzle by using the vacuum to lift a part to the vacuum cup, a pick and place confirming sensor which outputs an electrical signal indicating presence or absence of a part lifted to the vacuum cup on the basis of a change in flow rate of air sucked in from the air suction port of the pick and place nozzle, a valve which controls suction of air from the pick and place nozzle using the vacuum, and an air suction passage which connects the pick and place nozzle, pick and place confirming sensor, valve, and vacuum generator to each other.

As the pick and place confirming sensor, one may be used which includes a base arranged in a gas channel, a heater formed as a thin film on a surface of the base, a plurality of temperature sensors formed as thin films on the surface of the base, and detection means for measuring a gas flow rate on the basis of a temperature distribution in the vicinity of the heater which is measured by the temperature sensors.

As the pick and place confirming sensor, one may be used which includes a flow sensor which detects a change in flow rate of air measured in the air suction passage between the valve and pick and place nozzle, and detection means for outputting an electrical signal indicating the presence or absence of a part lifted to the vacuum cup on the basis of an output from the flow sensor. Particularly, a change in flow rate of air measured in a portion of the air suction passage which is in the vicinity of the pick and place nozzle may be detected.

The pick and place nozzle may include a plurality of pick and place nozzles which suck in air through corresponding air suction ports by sharing the vacuum source, so as to lift different parts. A pick and place confirming sensor may be provided for each of the pick and place nozzles.

As the pick and place nozzle, one including an air suction port which is provided to one open end and through which air is sucked in may be used.

As the pick and place nozzle, one may be used which includes an air suction hole in which a flow speed of air sucked in through the air suction port by the vacuum becomes a sonic speed. Alternatively, as the pick and place nozzle, one may be used which includes an air suction hole which has a channel sectional area with such a size that a flow speed of air sucked in through the air suction port by the vacuum becomes a sonic speed and in which an opening area of the air suction port changes in accordance with a state of a part lifted to the vacuum cup.

The pick and place nozzle may further include an air suction hole which opens to the air suction port and guides air, sucked in through the air suction port, to a nozzle inner chamber of the pick and place nozzle connected to and in contact with the vacuum generator. The vacuum generator may generate a vacuum with which a pressure at an upstream end of the air suction hole is substantially not less than twice a pressure at a downstream end.

A pick and place confirming sensor according to the present invention comprises a flow sensor which detects a change in flow rate of air, and detection means for outputting an electrical signal on the basis of an output from the flow sensor.

The flow sensor may include a base arranged in a gas channel, a heater formed as a thin film on a surface of the base, and a temperature sensor formed as a thin film on the surface of the base. The detection means may measure a gas flow rate on the basis of a temperature distribution in the vicinity of the heater which is measured by the temperature sensor.

The detection means may output an electrical signal indicating presence or absence of a part lifted to the vacuum cup of the pick and place nozzle on the basis of a change in flow rate of air measured in an air suction passage between the pick and place nozzle and a valve which controls suction of air from the pick and place nozzle of a vacuum pick and place device.

The detection means may output an electrical signal indicating presence or absence of a part lifted to the vacuum cup on the basis of a change in flow rate of air measured in a portion of the air suction passage which is in the vicinity of the pick and place nozzle.

The detection means may output an electrical signal indicating presence or absence of a part lifted to the air suction port on the basis of a change in flow rate of air sucked in through an air suction hole which includes an air suction port of a pick and place nozzle of a vacuum pick and place device as one open end and in which a flow speed of air sucked in through the air suction port becomes a sonic speed.

The detection means may output an electrical signal indicating presence or absence of a part lifted to the air suction port on the basis of a change in flow rate of air sucked in through an air suction hole which includes an air suction port of an pick and place nozzle of a vacuum pick and place device as one open end and has a channel sectional area with such a size that a flow speed of air sucked in through the air suction port becomes a sonic speed, and in which an opening area of the air suction port changes in accordance with a state of a part lifted to the vacuum cup of the pick and place nozzle.

A connector to be connected to the air suction passage is further provided.

A board which mounts and holds the flow sensor thereon is provided.

The temperature sensor further includes an upstream temperature sensor arranged on an upstream side of a gas flowing direction, a downstream temperature sensor arranged on a downstream side, and an ambient temperature sensor arranged near the upstream side of the base.

The base has a cavity at a central portion thereof, and a diaphragm which thermally insulates the temperature sensor and base from each other is further provided on the cavity.

BRIEF DESCRIPTION OF THE DRAWINGS

FIGS. 5A and 5B are output waveform charts showing outputs from the pick and place confirming sensor; and FIG. 6 is a graph for explaining the operation characteristics of the pick and place nozzle.

DESCRIPTION OF THE PREFERRED EMBODIMENT

An embodiment of the present invention will be described with reference to the drawings.

Figure 1A:
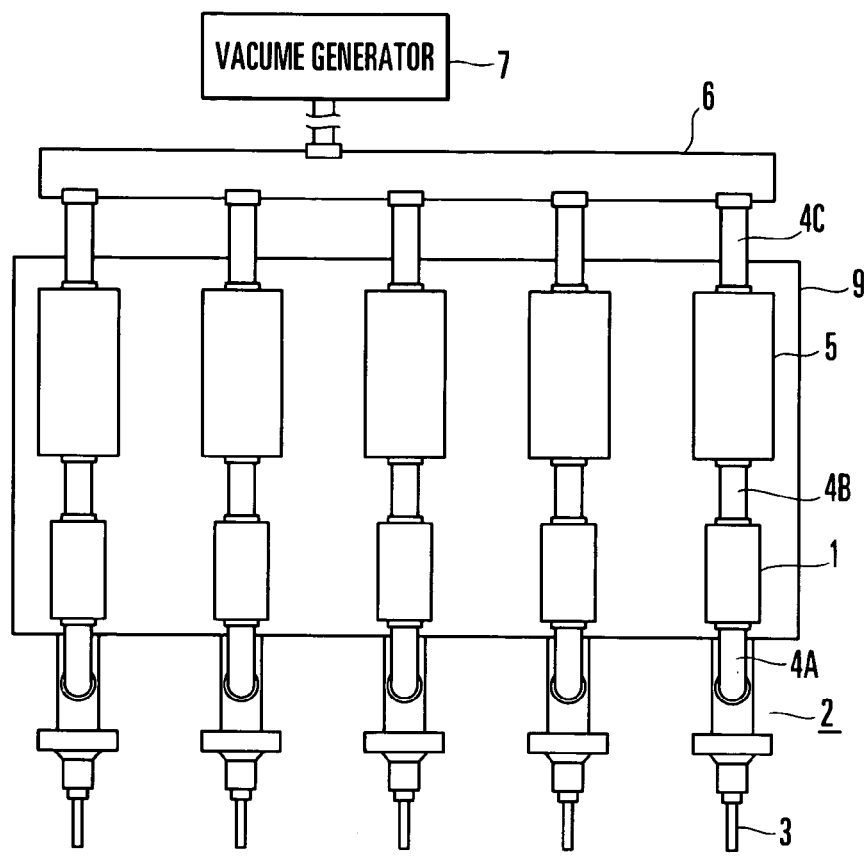
FIGS. 1A and 1B are views showing the outer appearance of a vacuum pick and place device according to an embodiment of the present invention.
Figure 1B:
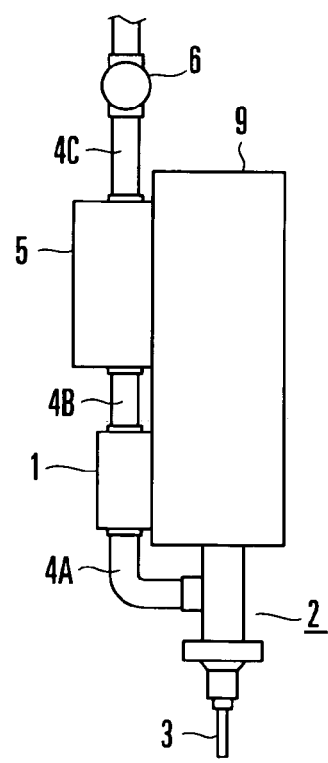
Figure 2:
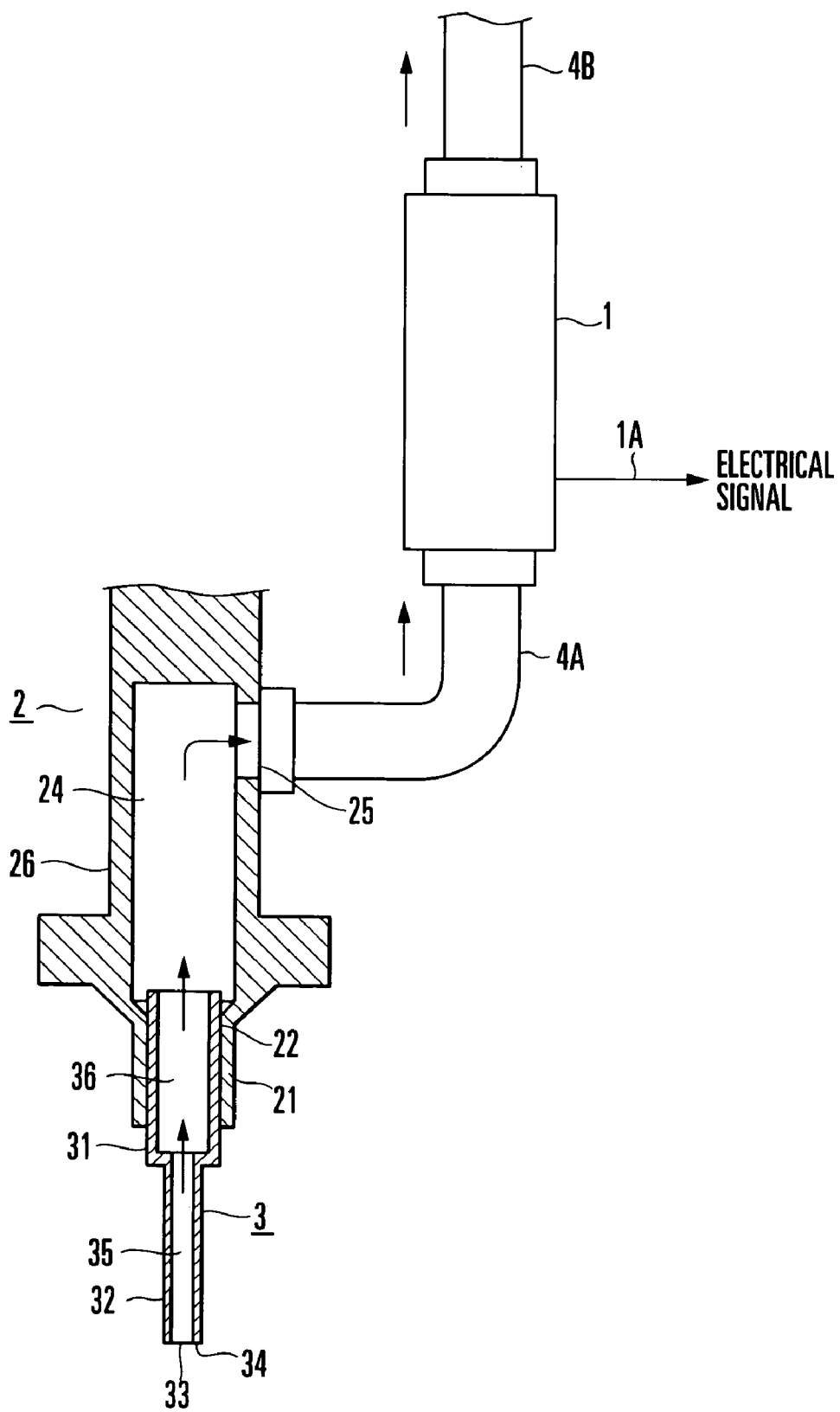
FIG. 2 is a sectional view showing a pick and place nozzle.

FIGS. 1A and 1B are views showing the outer appearance of a vacuum pick and place device according to an embodiment of the present invention, in which FIG. 1A is a front view, and FIG. 1B is a side view. FIG. 2 is a view showing the structure of a pick and place nozzle.

FIGS. 1A and 1B show as an example a vacuum pick and place device used in a mounter apparatus which mounts a chip part on a printed wiring board. A vacuum pick and place device used in a modular type (X-Y type) mounter apparatus in which a plurality of pick and place nozzles are arranged on a straight line will be described as the example hereinafter. The present invention can be similarly applied to a rotary type mounter apparatus in which a plurality of pick and place nozzles are arranged on a circumference.

The vacuum pick and place device according to the present invention has pick and place confirming sensors 1, pick and place nozzles 2, air suction passages 4A to 4C, valves 5, pipe 6, vacuum generator 7, and head unit 9.

A plurality of (five in this case) pick and place nozzles 2 are detachably attached to the bottom of the head unit 9 equidistantly, to control the elevating operation of nozzle portions 3 formed at the distal ends of the pick and place nozzles 2 and a rotating operation of the nozzle portions 3 about the vertical direction of the nozzle portions 3 as an axis. Regarding the planar (X-Y) positions of the pick and place nozzles 2, for example, the head unit 9 itself is conveyed by the X-Y moving mechanism (not shown) of the mounter apparatus to a desired position.

The pick and place nozzles 2 are commonly connected to the pipe 6 through the air suction passages 4A, pick and place confirming sensors 1, air suction passages 4B, valves 5, and air suction passages 4C, and share the vacuum generated by the vacuum generator 7 to lift parts.

Each valve 5 controls supply of the vacuum/atmospheric pressure to the corresponding pick and place nozzle 2, and controls parts pick and place/release. Each pick and place confirming sensor 1 is a sensor which comprises a gas flowmeter and detects the presence or absence of a part lifted to the pick and place nozzle 2 on the basis of the flow rate of air sucked in from the pick and place nozzle 2.

As shown in FIG. 2, each pick and place nozzle 2 is mainly made of a cylindrical nozzle main body 26 having an inner chamber 24. A cylindrical holder portion 21 having a hole 22 connected to and in contact with the inner chamber 24 is formed at the lower end of the pick and place nozzle 2 such that the holder portion 21 is integral with the nozzle main body 26.

Each nozzle portion 3 forms a cylinder having a nozzle inner chamber 36, and is integrally formed with a fitting portion 31 which is fitted in the hole 22 of the holder portion 21 and held to be vertically movable, and a cylindrical distal end portion 32 formed at the lower end of the fitting portion 31.

The distal end portion 32 has a vacuum cup 34 having an air suction port 33 at its lower end. The vacuum cup 34 lifts a part. An air suction hole 35 is formed in the distal end portion 32. The air suction hole 35 has the air suction port 33 as one open end thereof. The other open end of the air suction hole 35 opens to the nozzle inner chamber 36 connected to and in contact with the vacuum generator 7.

Figure 3A:
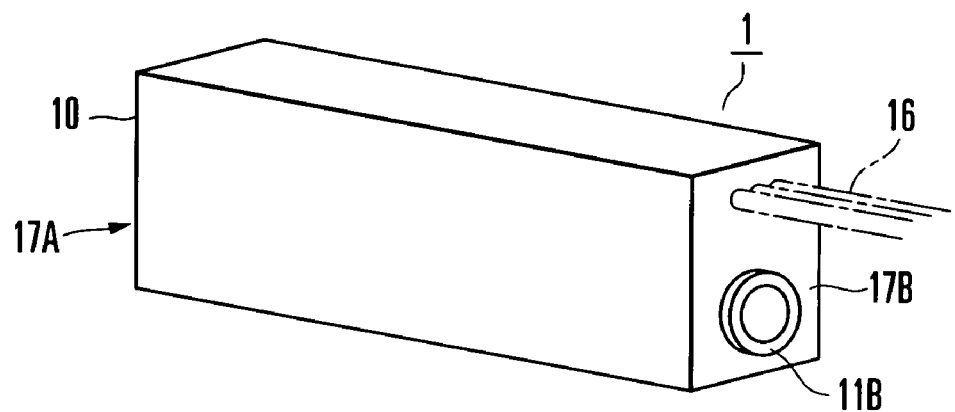
FIGS. 3A and 3B are views showing the structure of a pick and place confirming sensor.
Figure 3B:
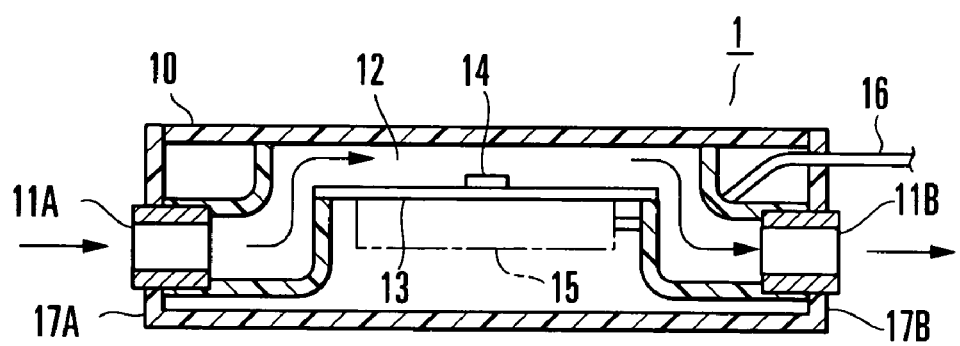
Figure 4A:
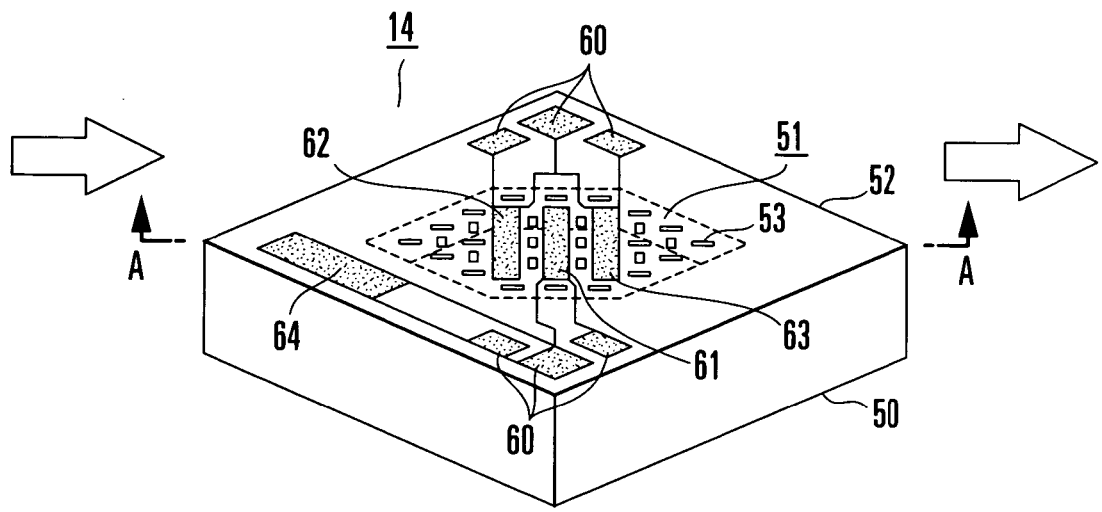
FIGS. 4A and 4B are views showing the structure of a flow sensor.
Figure 4B:
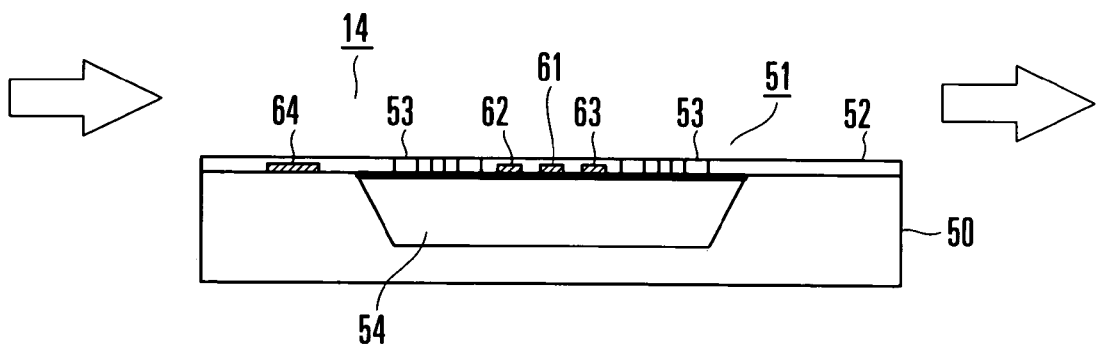

A pick and place confirming sensor according to one embodiment of the present invention will be described with reference to FIGS. 3A, 3B, 4A, and 4B. FIGS. 3A and 3B are views showing the structure of the pick and place confirming sensor, in which FIG. 3A is a view showing the outer appearance, and FIG. 3B is a front sectional view. FIGS. 4A and 4B are views showing the structure of a flow sensor used in the pick and place confirming sensor, in which FIG. 4A is a perspective view, and FIG. 4B) is an A-A sectional view.

The pick and place confirming sensor 1 is a rectangular parallelepiped as a whole. A channel 12 through which air flows is formed in a case 10 constituted by a molded product made of a plastic resin. A flow sensor 14 for measuring the flow rate of air flowing in the channel 12 is arranged in the channel 12.

The inlet and outlet of the channel 12 are formed in respective side surfaces 17A and 17B which oppose each other in the longitudinal direction of the case 10. Connectors 11A and 11B to be connected to the air suction passages 4A and 4B are provided to the side surfaces 17A and 17B, respectively.

The flow sensor 14 is held as it is mounted on the channel 12 side of a board 13. On the lower side of the board 13, that is, on that side where the flow sensor is not mounted, a detection circuit 15 (detector) is mounted which controls the flow sensor 14 to measure the flow rate of air in the channel 12, and outputs an electrical signal 1A indicating the presence or absence of a part lifted to the pick and place nozzle 2 from a wiring line 16. Namely, the board 13 forms the wall of the channel.

As shown in FIGS. 4A and 4B, the flow sensor 14 is obtained by forming a heater 61, upstream temperature sensor 62, downstream temperature sensor 63, ambient temperature sensor 64, and electrodes 60 as thin films on the surface of a base 50 made of a base material such as a silicon chip by using a pattern of platinum or the like, and covering the thin films with an insulating film layer 52.

The heater 61 is arranged at the center of the base 50. The upstream temperature sensor 62 is arranged on the upstream side of the gas flowing direction. The downstream temperature sensor 63 is arranged on the opposite downstream side. The ambient temperature sensor 64 is arranged near the upstream side of the base 50.

At the central portion of the base 50, part of the base material is removed by a process such as anisotropic etching to form a cavity (recessed space) 54. The heater 61, upstream temperature sensor 62, and downstream temperature sensor 63 are formed on a diaphragm 51 thermally isolated from the base 50. A large number of vent holes 53 are formed in the diaphragm 51 to extend in the direction of thickness of the diaphragm 51, so that air flows into the cavity 54 as well.

The flow sensor 14 operates on the following principle. Air is heated by the heater 61 such that its temperature is higher than the air temperature measured by the ambient temperature sensor 64 by a predetermined temperature. The temperature distribution of air is measured by the upstream temperature sensor 62 and downstream temperature sensor 63 to measure the air flow rate.

When air is still, the temperature distribution obtained by the upstream temperature sensor 62 and downstream temperature sensor 63 is axi-symmetrical. When air flows, this symmetry is lost, and the temperature obtained by the downstream temperature sensor 63 becomes higher than the temperature obtained by the upstream temperature sensor 62. This temperature difference is detected by a bridge circuit to obtain an air flow rate (mass flow rate) on the basis of physical values such as the thermal conductivity of air.

With this flow sensor 14, the size of the sensor itself can be decreased. Each temperature sensor and the base are thermally insulated from each other by the diaphragm structure. Thus, a high sensitivity and high response speed can be obtained without being adversely affected by the ambient temperature. Also, power consumption can be decreased.

Therefore, a very small flow rate change in the form or sucked air in accordance with the presence or absence of a part lifted to the pick and place nozzle 2 can be detected accurately within a short period of time.

The operation of the vacuum pick and place device according to this embodiment will be described with reference to FIGS. 5A, 5B, and 6. FIGS. 5A and 5B are output waveform charts (actual measurement values) showing outputs from the pick and place confirming sensor 1 of the vacuum pick and place device. FIG. 6 is a graph for explaining the operation characteristics of the pick and place nozzle.

When the valve 5 is switched to the vacuum generator 7 side, air is sucked in through the air suction port 33 of the nozzle portion 3 due to the vacuum generated by the vacuum generator 7, and is guided to the inner chamber 24 through the air suction hole 35 and nozzle inner chamber 36.

After that, air flows toward the air suction passage 4A through a hole 25 formed in the side wall of the nozzle main body 26, and enters the pick and place confirming sensor 1. The air flow rate is measured by the pick and place confirming sensor 1, and air reaches the vacuum generator 7 through the air suction passage 4B, valve 5, air suction passage 4C, and pipe 6. Thus, a part located immediately under the air suction port 33 of the pick and place nozzle 2 is lifted to the vacuum cup 34.

When the valve 5 is switched to the atmospheric pressure side, air suction from the air suction port 33 stops, and the part lifted to the vacuum cup 34 is released.

In an open state wherein no part is lifted to the pick and place nozzle 2, comparatively large amount of air is sucked in through the air suction port 33, as indicated by a measurement flow rate value 71 of FIG. 5B. Thus, the output from the pick and place confirming sensor 1 indicates a high output voltage. In a state wherein a part is lifted, the part decreases the opening area of the air suction port 33, so that the air amount sucked in through the air suction port 33 decreases. Thus, the output from the pick and place confirming sensor 1 indicates a low output voltage.

Therefore, the presence or absence of a lifted part can be determined on the basis of a difference in output voltage between the released state and lifted state.

Usually, the atmospheric pressure changes depending on the weather, temperature, or altitude. The vacuum generated by the vacuum generator 7 includes positive and negative fluctuation margins due to the structural factor of the device. Furthermore, as shown in FIG. 1A, if one vacuum is shared by a plurality of pick and place nozzles, the vacuum changes when another pick and place nozzle operates.

Therefore, when the pneumatic pressure on the outlet side of the pick and place nozzle which is measured by using a pressure sensor is to be measured as in the conventional case, the measurement result is directly adversely affected by various types of disturbances as described above. In particular, when a pick and place nozzle having a small channel sectional area is used, the pressure drop in the pick and place nozzle is large, and accordingly the pressure difference caused by the presence or absence of a lifted part tends to be small. Disturbance is added to this tendency to decrease the S/N ratio. Consequently, the presence or absence of a lifted part cannot be determined accurately.

In order to exclude the influence of the disturbance, the reference pressure value for determination may be adjusted when necessary. In this case, an adjustment operation becomes necessary, which decreases the operating efficiency of the mounter apparatus.

In contrast to this, the present invention pays attention to the characteristics of the pick and place nozzle 2 described above. The presence or absence of a lifted part is detected by measuring the mass flow rate or air sucked in from the pick and place nozzle 2.

In the vacuum pick and place device used in the mounter apparatus which mounts a chip part on a printed wiring board, the channel sectional area of the air suction hole 35 (air suction port 33) of the pick and place nozzle 2 is small. To obtain a desired part lifting force, air is sucked in by the vacuum generator 7 with a vacuum sufficiently different from the atmospheric pressure. In the released state wherein no part is lifted, the air flow speed at the air suction hole 35 of the pick and place nozzle 2 is constant, that is, a sonic speed (344 m/s when the atmospheric temperature is 20° C.).

Generally, it is known that when a pressure ratio Pin/Pout (absolute pressure ratio) of an inlet side pressure Pin to an outlet side pressure Pout of an air passage has a predetermined value, i.e., substantially 2 or more, the flow rate in the air passage is a predetermined speed equal to the sonic speed, as shown in FIG. 6. This air passage is called a sonic nozzle.

In the pick and place nozzle 2 of the vacuum pick and place device used in the mounter apparatus, due to the sufficient vacuum required to lift a part, the air suction hole 35 is very narrow and a sufficient pressure ratio is formed. Thus, the air suction hole 35 is used in a saturation segment where the air flow speed is a sonic speed. In other words, when the above pressure ratio is maintained, even when the vacuum changes, the air flow speed in the air suction hole 35 is constant.

The mass flow rate accordingly becomes no longer related to the pressure. A high S/N ratio can be obtained as a flow rate signal without being adversely affected by a disturbance caused by the operation of the vacuum generator or pick and place nozzles arranged in a row, i.e., by pressure fluctuation.

As the mass flow rate is obtained from the product of the opening area and the sonic speed, it depends on the opening area. The opening area changes in accordance with the presence or absence of a lifted part. If the mass flow rate is detected, a change in opening area, that is, the presence or absence of a lifted part can be determined accurately from the magnitude of the mass flow rate. Hence, the released state can be determined accurately. Therefore, the determination is not much adversely affected by the posture of the lifted part, and can be made well even with a pick and place head in which the vacuum cup has a three-dimensional structure and a part is lifted obliquely.

In the above description, a pick and place nozzle which lifts a small part such as an electronic part is described. When another article is to be lifted by a vacuum, as a pick and place nozzle, one having an air suction hole with a channel sectional area with which the air flow speed becomes constant (sonic speed) in a released state or with which the pressure ratio described above can be obtained may be used. For example, in FIG. 2 described above, the air suction hole 35 formed in the distal end portion 34 of the lifting nozzle 2 has a substantially constant shape from the upstream end to the downstream end with a channel sectional area as described above.

This will be expressed strictly on the basis of the principle of the sonic nozzle described above. The air suction hole 35 suffices as far as it has the above channel sectional area at the air suction port 33 and the channel sectional area at the air suction port 33 is narrowest in the air channel after the air suction port 33 before the pipe 6.

This will be expressed from the vacuum side. A vacuum with which the ratio of pressures at the two ends of the air suction hole 35 of the pick and place nozzle 2 becomes twice or more may be used. The pressure at the downstream end of the air suction hole 35 may be measured actually, or may be estimated from the pressure measured in the nozzle inner chamber 36, inner chamber 24, or air suction passage 4A, and a pressure gradient from the pressure measurement position to the downstream end of the air suction hole 35.

FIGS. 5A and 5B described above show output voltages obtained when the pick and place nozzle 2 having the air suction port 33 (air suction hole 35) with a channel sectional area of $\phi 0.2$ is used. For comparison, an output voltage obtained when a pressure sensor is used is shown.

The pressure sensor is a general one having a measurement span to correspond to the vacuum output (an absolute pressure of about 30 kPa) of the vacuum generator 7 widely used in the mounter apparatus. FIGS. 5A and 5B show the output voltages of the two cases in the released state. The difference in output between before and after parts pick and place is smaller in output characteristics 72 of the pressure sensor than in the output characteristics 71 of the air flow rate sensor.

In addition to the fact that the output difference is originally small, due to the disturbance described above, the output characteristics fluctuate to decrease the S/N ratio. Thus, a margin cannot be maintained with respect to a reference pressure value 74, and it is difficult to determine the presence or absence of a lifted part by using a pressure sensor.

In contrast to this, concerning an air flow rate, a certain degree of an output difference can be obtained, and the disturbance described above has substantially no influence, so that a high S/N ratio can be obtained. Thus, a sufficient margin can be maintained with respect to a reference flow rate value 73, and the presence or absence of a lifted part can be determined accurately.

Regarding the layout position of the pick and place confirming sensor 1, as far as it is located on the air suction passage 4A or 4B that connects the pick and place nozzle 2 and valve 5 to each other, as shown in FIGS. 1A and 1B, regardless of where it is arranged, it can measure the flow rate of air sucked in from the pick and place nozzle 2.

Air flows taking time, although short. If the pick and place confirming sensor 1 is arranged in the vicinity of the pick and place nozzle 2, of the air suction passages 4A and 4B, the delay time in detection of a lifted part can be shortened.

According to the embodiment described above, a pick and place nozzle is provided which includes a vacuum cup having an air suction port. When air is sucked in from the air suction port of the pick and place nozzle by using a vacuum to lift a part to the vacuum cup, a pick and place confirming sensor is used to output an electrical signal indicating presence or absence of a part lifted to the vacuum cup on the basis of a change in flow rate of air sucked in from the air suction port of the pick and place nozzle. Even when a pick and place nozzle having an air suction port with a small channel sectional area is used, the presence or absence of a lifted part can be detected more reliably than in a conventional case wherein it is detected by using a pressure sensor.

As described above, the vacuum pick and place device and pick and place confirming sensor according to the present invention are suitable for transporting a small part such as an electronic part, and are particularly suitable for detecting the presence or absence of a part lifted to a vacuum cup.

The invention claimed is:

1. A vacuum pick and place device comprising:
   a plurality of pick and place nozzles, providing a lifting portion opened with an air suction port and an air suction hole where a flow rate of air sucked in from said air suction port becomes a sonic speed by a vacuum pressure, for lifting individual parts at said lifting portion by sucking in air through said air suction hole from said air suction port,
   a plurality of air suction passages connected to each of said plurality of pick and place nozzles,
   a pipe to which said plurality of air suction passages is connected in parallel,
   a vacuum supply unit which is connected to said pipe, and, which supplies a vacuum through said pipe and said plurality of air suction passages to each of said plurality of pick and place nozzles with which a pressure at said air suction port is at least approximately twice a pressure at a downstream end of said air suction hole, and
   a plurality of pick and place confirming sensors which are provided in each of said plurality of air suction passages, and, which measure a flow rate of air sucked in from said air suction port of said pick and place nozzle and output an electrical signal indicating the presence or absence of a part lifted to said lifting portion on the basis of the measured flow rate.

2. A vacuum pick and place device according to claim 1, wherein each pick and place confirming sensor of the plurality of pick and place confirming sensors includes
   a base arranged in a gas channel,
   a heater formed as a thin film on a surface of said base,
   a plurality of temperature sensors formed as thin films on said surface of said base,
   measuring means for measuring a mass flow rate on the basis of a temperature distribution in the vicinity of said heater which is measured by said temperature sensors, and
   detection means for outputting an electrical signal indicating the presence or absence of a part lifted to said lifting portion on the basis of an output from said measurement means.

3. A vacuum pick and place device according to claim 1, further comprising:
   a plurality of valves which are provided in each of said plurality of air suction passages, and, which control suction of air from each respective pick and place nozzle using the vacuum.

4. A vacuum pick and place device according to claim 3, wherein each pick and place confirming sensor of the plurality of pick and place confirming sensors includes
   a flow sensor which measures a mass flow rate of air measured in said air suction passage between said valve and said pick and place nozzle, and
   detection means for outputting an electrical signal indicating the presence or absence of a part lifted to said lifting portion on the basis of an output from said flow sensor.

5. A vacuum pick and place device according to claim 4, wherein said flow sensor detects a change in flow rate of air measured in a portion of each respective air suction passage which is in the vicinity of each respective pick and place nozzle.

6. A vacuum pick and place device according to claim 1, wherein an opening area of the air suction port in each respective pick and place nozzle changes in accordance with a state of a part lifted to said lifting portion.

7. A vacuum pick and place device according to claim 1, wherein said air suction hole which opens to said air suction port, leads the air sucked in from said air suction port to a nozzle inner chamber of each respective pick and place nozzle in communication with each respective air suction passage.

* * * * *